United States Patent
Suresh et al.

(10) Patent No.: US 10,846,449 B1
(45) Date of Patent: Nov. 24, 2020

(54) CONVERSION OF BLOCK MODEL-BASED CIRCUIT DESIGNS INTO CIRCUIT IMPLEMENTATIONS

(71) Applicant: Xilinx, Inc., San Jose, CA (US)

(72) Inventors: Avinash Somalinga Suresh, Hyderabad (IN); Nabeel Shirazi, Saratoga, CA (US); Daniel E. Michek, San Diego, CA (US); Daniel G. Gibbons, Niwot, CO (US)

(73) Assignee: Xilinx, Inc., San Jose, CA (US)

( * ) Notice: Subject to any disclaimer, the term of this patent is extended or adjusted under 35 U.S.C. 154(b) by 45 days.

(21) Appl. No.: 16/216,961

(22) Filed: Dec. 11, 2018

(51) Int. Cl.
  *G06F 30/327* (2020.01)
  *G06F 30/34* (2020.01)
  *G06F 30/331* (2020.01)
  *G06F 8/41* (2018.01)
  *G06F 30/30* (2020.01)

(52) U.S. Cl.
  CPC .......... *G06F 30/327* (2020.01); *G06F 8/443* (2013.01); *G06F 8/447* (2013.01); *G06F 30/331* (2020.01); *G06F 30/34* (2020.01); *G06F 30/30* (2020.01)

(58) Field of Classification Search
  CPC ........ G06F 30/327; G06F 30/30; G06F 30/34; G06F 8/447; G06F 30/33; G06F 30/331; G06F 8/443
  See application file for complete search history.

(56) References Cited

U.S. PATENT DOCUMENTS

| | | | | |
|---|---|---|---|---|
| 7,155,708 B2 * | 12/2006 | Hammes | ................. | G06F 30/33 717/155 |
| 7,299,458 B2 * | 11/2007 | Hammes | ................. | G06F 30/30 717/133 |
| 7,565,631 B1 * | 7/2009 | Banerjee | ................. | G06F 30/30 716/103 |
| 7,703,085 B2 * | 4/2010 | Poznanovic | ............ | G06F 8/447 717/140 |
| 7,992,111 B1 * | 8/2011 | Ma | ............................ | G06F 8/34 716/101 |
| 8,079,013 B1 * | 12/2011 | Ma | ........................ | G06F 30/30 716/139 |
| 8,156,459 B1 * | 4/2012 | Ou | ............................ | G06F 8/10 703/14 |
| 8,205,175 B2 * | 6/2012 | Waters | ...................... | G06F 8/44 716/101 |
| 8,762,916 B1 * | 6/2014 | Kathail | .................... | G06F 30/34 716/116 |
| 9,529,946 B1 * | 12/2016 | Schumacher | ........... | G06F 11/00 |
| 10,180,850 B1 * | 1/2019 | Kasat | .................... | G06F 9/4411 |
| 10,691,580 B1 * | 6/2020 | Kasat | ...................... | G06F 9/455 |

OTHER PUBLICATIONS

Jelemenská et al.; "HSSL specification high-level synthesis"; 2015 13th International Conference on Emerging eLearning Technologies and Applications (ICETA); Conference Paper; Publisher: IEEE (Year: 2015).*

* cited by examiner

*Primary Examiner* — Helen Rossoshek

(74) *Attorney, Agent, or Firm* — Crawford Maunu PLLC

(57) ABSTRACT

A design tool executing on a computer system converts a block model of a circuit design to a high-level language (HLL) specification. The design tool then converts the HLL specification to a hardware description language (HDL) specification. Circuit implementation data is generated from the HDL specification by the design tool, and the circuit implementation data can be used to make an integrated circuit that performs functions specified by the circuit design.

18 Claims, 6 Drawing Sheets

US 10,846,449 B1

CONVERSION OF BLOCK MODEL-BASED CIRCUIT DESIGNS INTO CIRCUIT IMPLEMENTATIONS

TECHNICAL FIELD

The disclosure generally relates to creating a circuit from a block-based specification of a circuit design.

BACKGROUND

A variety of electronic design automation (EDA) tools are available to designers who have different backgrounds in designing electronic systems. For example, XILINX, Inc., provides a high-level synthesis (HLS) tool for software developers, a hardware description language (HDL) tool for hardware developers, and a System Generator for DSP® tool for model-based design developers. The tools support design entry, verification, and generation of circuit implementations.

An HLS tool supports design entry in high-level languages (HLLs), such as C or C++, and provides functions for design verification and synthesis into register transfer language (RTL) and implementation in hardware. HLS tools are geared towards designers who are proficient in software programming and knowledgeable about hardware design concepts for writing synthesizable HLL code with hardware directives that guide the HLS in preparing circuit implementation data for creating a circuit that satisfies performance requirements.

An HDL tool supports design entry in languages such as VHDL and Verilog. HDL tools support design verification and synthesis into implementation data for creating a circuit. Designers who use HDL tools are assumed to be proficient in working with HDLs and knowledgeable about the target hardware.

Block-based modeling tools allow users to create circuit designs by instantiating and interconnecting blocks, which represent high-level functions, on a design canvas. However, block-based circuit design modeling tools generally lack blocks that represent highly abstracted functions, support only a limited number of data types, and do not support vectors and matrices. In addition, simulation of block-based models tends to be slow as the simulation relies on cycle accurate simulation results. Effective use of such block-based modeling tools can depend on the designer's familiarity with the target hardware and RTL generated by the tool from the block-based model.

SUMMARY

In a disclosed method, a design tool executing on a computer system converts a block model of a circuit design to a high-level language (HLL) specification. The design tool then converts the HLL specification to a hardware description language (HDL) specification. Circuit implementation data is generated from the HDL specification by the design tool, and the circuit implementation data can be used to make an integrated circuit that performs functions specified by the circuit design.

A disclosed system includes a computer processor and a memory arrangement. The memory arrangement is configured with instructions that when executed by the computer processor cause the computer processor to convert a block model of a circuit design to a high-level language (HLL) specification. The instructions further cause the computer processor to convert the HLL specification to a hardware description language (HDL) specification and generate circuit implementation data from the HDL specification. The circuit implementation data can be used to make an integrated circuit that performs functions specified by the circuit design.

Other features will be recognized from consideration of the Detailed Description and Claims, which follow.

BRIEF DESCRIPTION OF THE DRAWINGS

Various aspects and features of the methods and system will become apparent upon review of the following detailed description and upon reference to the drawings in which.

DETAILED DESCRIPTION

Figure 1:
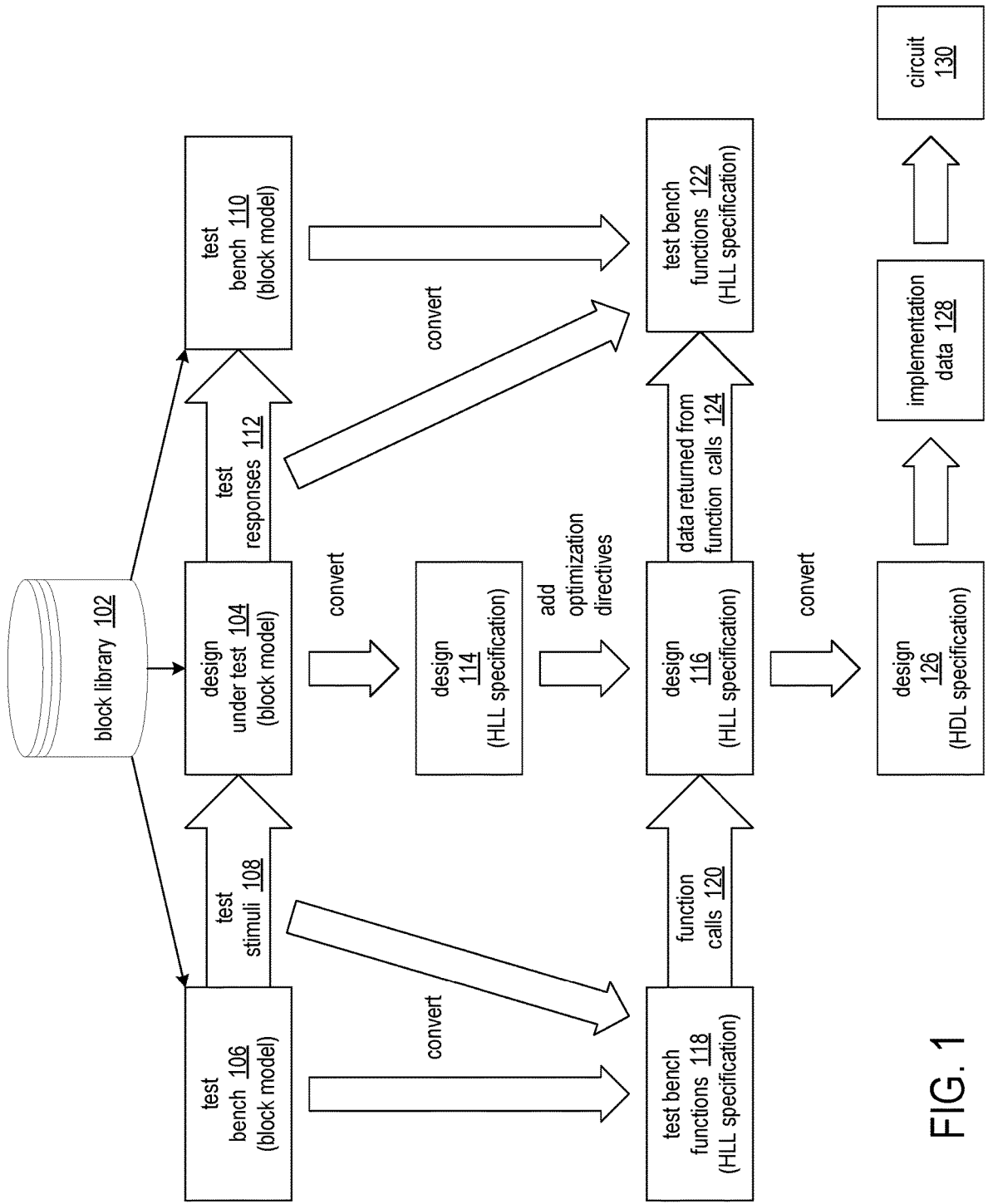
FIG. 1 shows an exemplary design flow in which a block-based circuit design model is converted to an HLL model, the HLL model is converted to an HDL specification, and the HDL specification is processed into circuit implementation data for creating an integrated circuit.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Current block-based circuit design tools possess a number of disadvantages. To effectively use the tools and prepare a circuit that satisfies all design criteria, a working knowledge of a target circuit technology, such as the architecture of a field programmable gate array (FPGA), adaptive compute acceleration platform (ACAP), or system-on-chip (SOC) is imperative. Also, oftentimes there is a one-to-one mapping of blocks to corresponding modules of RTL code, limiting opportunities for optimizing the design and putting designers not experienced with RTL at a disadvantage. The disclosed approaches support development of circuit designs by designers who have little or no experience with the target hardware and are not proficient with HDLs. The methods and system enable circuit design to a wider range of designers and applications than past approaches.

In one approach, a block-based modeling tool provides a library of blocks that abstract associated functions and support a variety of data types, such as floating point, signed/unsigned integers, arbitrary fixed-point types, and complex value notations. In addition, depending on the abstracted function, some blocks support inputs such as scalars, one-dimensional vectors, and two-dimensional matrices. The tool allows the designer to drag and drop selected blocks onto a design canvas and specify connections and data types according to application requirements.

In the system created by the designer, one part of the system can be referred to as the design under test (DUT) and is targeted for implementation on a particular integrated circuit, such as an FPGA or application-specific integrated circuit (ASIC). Another part of the system is referred to as the test bench, the purpose of which is to apply stimuli to the DUT and to check responses from the DUT.

Rather than converting the system from a block model directly to an HDL specification as in prior approaches, the modeling tool first converts the block model of the system into an HLL specification. The conversion of the block model to an intermediate HLL specification allows the modeling tool to analyze the design for opportunities to automatically insert in the HLL specification hardware optimization directives to improve performance of the circuit to be implemented. Thus, performance of the circuit implemented by the design can be improved without the designer having expertise on the capabilities of the target device.

Once the modeling tool has generated an HLL specification and inserted hardware optimization directives, the tool can generate an HDL specification and then generate circuit implementation data. The circuit implementation data can be used to make a circuit that operates consistent with the DUT.

The disclosed modeling tool enables fast design cycles by employing functional models of the blocks, which demonstrate bit accurate behavior, for simulation and verification flow. The modeling tool generates synthesizable HLL code as output, and existing HLS tools can be used to transform the HLL code into circuit implementation data. Performance constraints can be satisfied through automatic generation of hardware optimization directives for the HLL code.

FIG. 1 shows an exemplary design flow in which a block-based circuit design model is converted to an HLL model, the HLL model is converted to an HDL specification, and the HDL specification is processed into circuit implementation data for creating an integrated circuit. The block library 102 includes blocks that are selectable by a designer to specify a design under test 104. In an exemplary implementation, functions of the blocks are specified by way of HLL-specific abstract syntax trees (ASTs). Each block has an associated AST that can be used in converting the block model design 104 into an HLL specification 114 of the design. An AST is a tree representation of the syntactical structure of the HLL source code specification of the block. Examples of blocks include computer vision blocks that support the analysis, manipulation and optimization of a digitized image; logic and bit operation blocks that support the compound logical operations and bit-wise operations; lookup table blocks that perform a one dimensional lookup operation with an input index; math function blocks that implement mathematical functions; ports and subsystem blocks that enable creation of subsystems and input/output ports; relational operation blocks that define a relation (numerical equality or inequality) between two data elements; signal attribute-include blocks for maintaining compatibility between input type and output type; signal operation blocks that support simple modifications to the time variable of the signal to generate new signals (e.g. unit delay); signal routing blocks that support the setup to track signal sources and destinations (e.g. bus selector); sinks-include blocks that receive physical signal output from other blocks; source-include blocks that generate or import signal data; tool-include blocks that control the implementation/interface of the model.

In an exemplary implementation, the disclosed approaches supplement and improve existing design tools. For example, the SIMULINK® graphical modeling environment can be improved by employing the disclosed approaches. The SIMULINK tool provides an interactive, graphical environment for modeling, simulating, analyzing and verifying system-level circuit designs. The design under test 104 can be created by selecting blocks from the block library 102 in a design editor. The designer can connect the instantiated blocks with signal lines to establish communication relationships between blocks. The library blocks can be integrated into the SIMULINK environment using an S-Function call-back, for example.

In addition to the design under test 104, the designer can specify a block model of a test bench 106, 110 for testing the design under test 104. The test bench can include blocks 106 that generate test stimuli 108 for input to the design under test and blocks 110 that capture test responses 112 from the design under test.

The design tool converts the block model of the DUT 104 to an HLL design specification 114. In one implementation, the tool generates a data flow graph from the functional blocks in the DUT block model 104. Based on the data flow graph and the ASTs associated with the blocks, the tool generates the HLL specification 114 of the design.

The tool can supplement the HLL specification 114 with hardware optimization directives and produce design specification 116 based on the information in the data flow graph. Examples of hardware optimization directives specify particular interfaces, such as streaming or point-to-point, elimination of buffers, pipelining, loop unrolling, and particular circuit elements such as shift registers and digital signal processors (DSPs).

Two simulations are run on the design under test. In the first simulation, which is run before converting the block model of the DUT 104 to the HLL specification 114, functional correctness of the DUT 104 is verified via simulation in the SIMULINK environment. The block library 102 includes functional models of the blocks that are bit accurate for faster compilation and simulation cycles. In the second simulation, functional correctness of the HLL specification of the DUT 116 is verified.

In order to prepare the second simulation, all inputs to the DUT 104 and all outputs from the DUT 104 in the first simulation are captured and used in converting the test bench 106 and 110 to HLL test bench functions 118 and 122. The test bench functions 118 and 122 mimic behavior of the test bench block model 106 and 110. Test bench functions 118 and 122 are shown as separate blocks for ease of illustration, though the HLL functions of 118 and 122 can be the same functions. The test bench functions 118 make function calls 120 to the HLL functions of DUT 116 and pass input data, which correspond to the test stimuli 108, and control and data 124, which correspond to test responses 112, are returned from the HLL functions of DUT 116 to the calling test bench functions. Correct operation of the HLL specification of the design 116 can be verified by determining whether the data returned 124 from simulation of the HLL design 116 is equivalent to the test responses 112 produced from simulation of the block model DUT 104.

Once functional correctness of the HLL design specification 116 has been verified, existing tools can be used to convert the HLL design specification to an equivalent HDL design specification 126. For example, the VIVADO® high-level synthesis tool from XILINX, Inc., can convert C and C++ design specifications into an HDL specification, and then generate circuit implementation data 128 from the HDL specification. Based on the HDL specification, the VIVADO tool can generate circuit implementation data for implementing a circuit 130 on an FPGA, for example. Other tools can generate circuit implementation data for implementing circuits 130 on other integrated circuit technologies.

Figure 2:
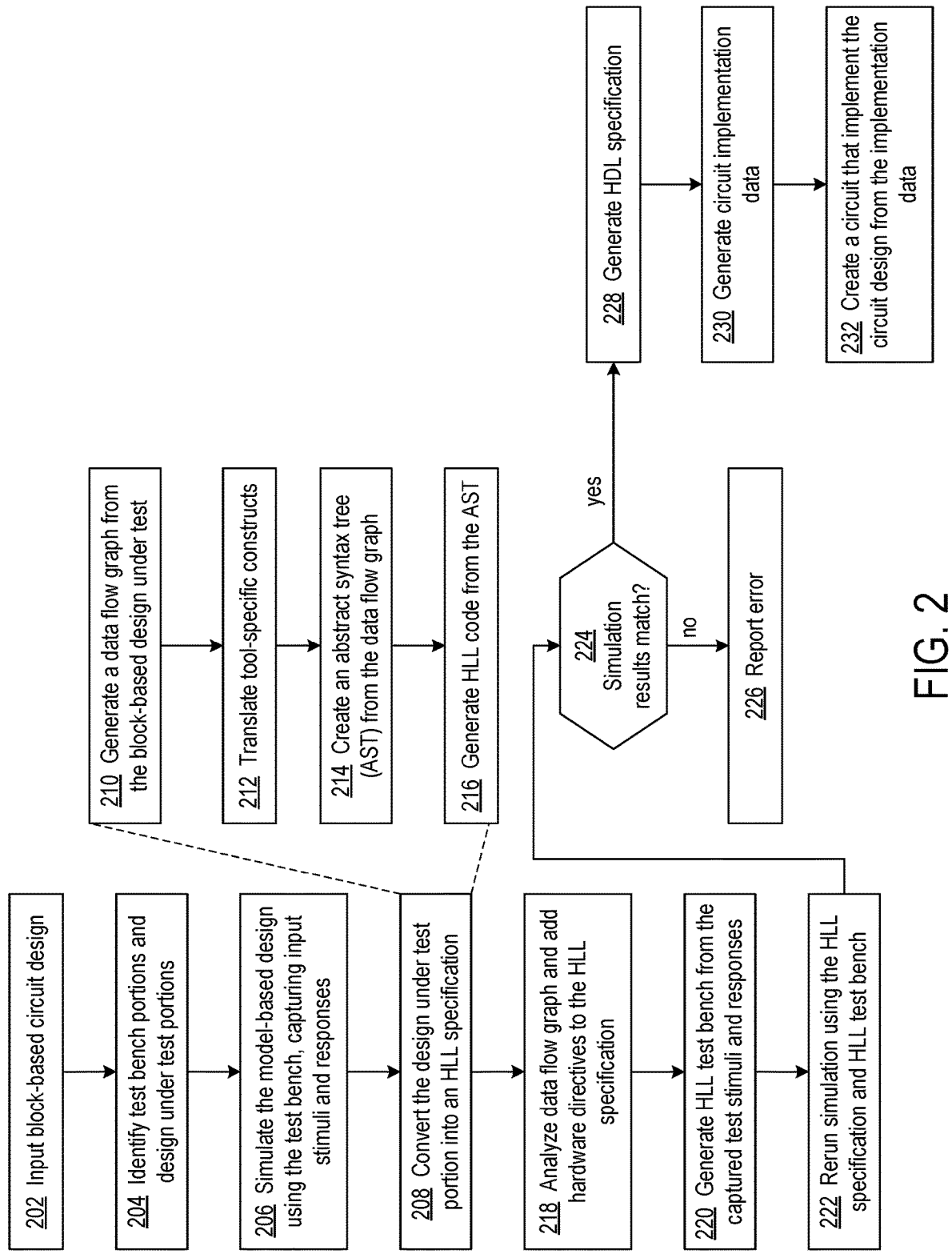
FIG. 2 is a flowchart of an exemplary process of converting a block-based circuit design model into circuit implementation data for making an integrated circuit.

FIG. 2 is a flowchart of an exemplary process of converting a block-based circuit design model into circuit implementation data for making an integrated circuit. At block 202, a design tool inputs a block-based circuit design, and at block 204, the tool identifies portions of the circuit design that constitute a test bench and portions of the circuit design that constitute a design under test in response to attributes of the blocks.

Figure 3:
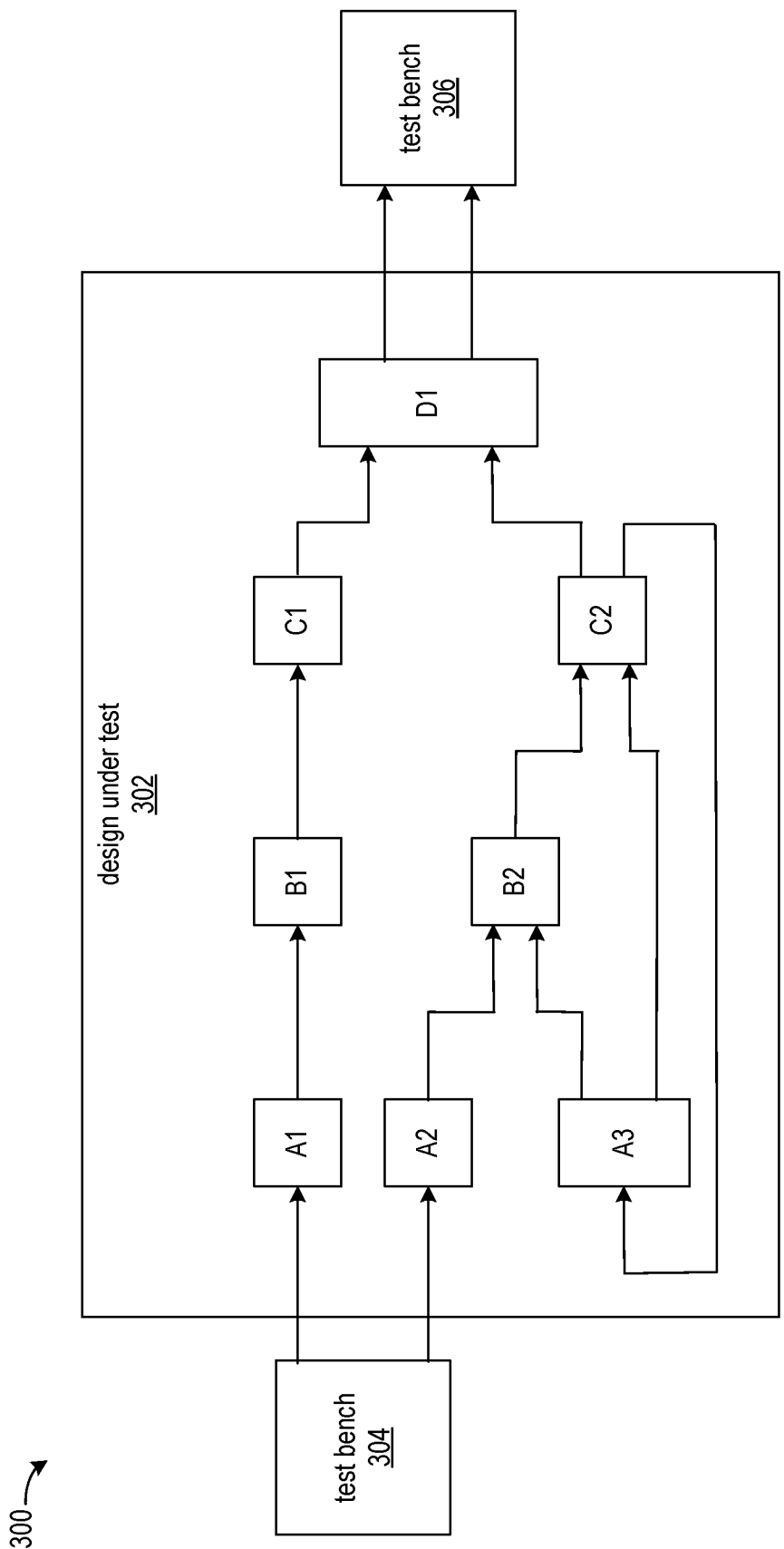
FIG. 3 shows an example of a block-based circuit design.

FIG. 3 shows an example of a block-based circuit design 300. The design includes a design under test 302 and test bench blocks 304 and 306. The design under test 302 includes blocks A1, A2, A3, B2, B2, C1, C2, and D1. Test bench block 304 provides input stimuli signals to blocks A1 and A2, and DUT block D1 outputs response signals to test bench block 306.

Returning now to FIG. 2, the block-based model is simulated at block 206, and all input stimuli to and all output responses from the DUT are captured and stored for use in constructing an HLL test bench and verifying correct operation of an HLL specification of the DUT.

At block 208, the HLL tool converts the block-based model into an HLL specification of the DUT. Blocks 210, 212, 214, and 216 show further details involved in converting the block-based model into an HLL specification of the DUT. At block 210, the tool generates a data flow graph from the block-based model.

Figure 4:
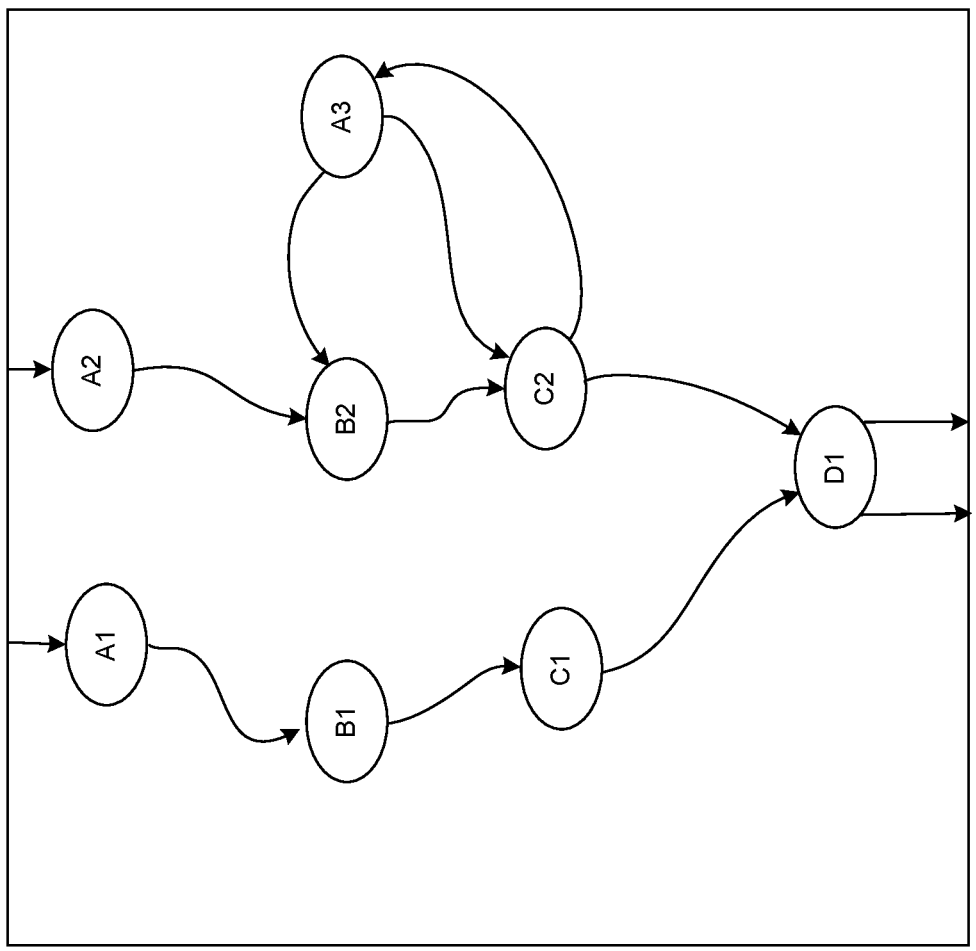
FIG. 4 shows a data flow graph generated from the block-based circuit design of FIG. 3.

FIG. 4 shows a data flow graph 400 generated from the block-based circuit design 300 of FIG. 3. The data flow graph includes vertices and edges that connect the vertices. Each vertex corresponds to one of the blocks of the block-based model 300. Each edge corresponds to one of the connections between blocks in the block-based model. The data flow graph is generated in order to allow the tool to create the HLL specification without being obstructed by the proprietary representation of the block-based model. The data flow graph 400 is a generic representation of the block-based model, amenable to traversal for generating the HLL specification and identifying opportunities for inserting hardware optimization directives.

Returning now to FIG. 2, at block 212, the tool translates tool-specific constructs used in the block-based model to representations in the data flow graph. For example, the block-based model can specify "From" and "Goto" blocks, which simplify the depiction of signal routing in the block model. The tool translates From and Goto blocks into edges that represent the signal connections in the data flow graph. In another example, blocks that are used for signal grouping, such as bus objects, are translated into individual edges in the data flow graph. In another example, tool-specific blocks that capture details such as the required target frequency, target hardware interface on the input and output ports etc., are used to specify or control the output generation process, but are not added as vertices to the data flow graph. The requirements can be used as meta-data in the generated output. In another example, blocks that capture design documentation are not added as vertices to the data flow graph, but data from the documentation blocks can be added in the comment section in the generated HLL code.

At block 214, the tool creates a DUT AST based on the vertices and edges of the data flow graph and the individual ASTs that describe the corresponding blocks of the block-based model. The HLL specification of the DUT is generated by the tool at block 216 based on the DUT AST.

Through analysis of the data flow graph and AST, the tool can identify particular circuit structures that can improve performance of the implemented circuit, and generate hardware optimization directives at block 218. The hardware optimization directives can be added to the HLL specification and processed by the HLL-to-HDL conversion tool. The directives can be specified as pragmas in the HLL code, for example. Examples of hardware optimization directives include interface directives, data flow directives, pipelining directives, loop unrolling directives, and hardware inference directives.

Interface directives can specify a streaming interface or a bi-directional point-to-point interface, for example. The data types of ports on blocks are carried over to the data flow graph and can be used to identify that a particular interface directive is desirable. For example, one-dimensional or two-dimensional data signals can indicate a streaming interface is beneficial, whereas a scalar data type can indicate a bi-directional point-to-point interface is beneficial.

Data flow directives can specify insertion of buffer circuits, such as ping-pong RAMs or first-in-first-out (FIFO) circuits to improve concurrency of operation. For example, in parts of an HLL program following a producer-consumer relationship, buffering data from the producer can allow the producer to continue operation even though the consumer has not completed processing previous output data, or allow the consumer to continue processing output data from the buffer even though the producer may be waiting for additional input data to process.

Pipelining directives can indicate that the associated HLL program code is to be translated into an HDL description that specifies a pipelined circuit. For example, a pipelining directive can be beneficial if the data flow graph shows a sequential arrangement of a set of vertices in which each vertex is either a single producer of a data to another vertex, a single consumer of data from another vertex, or a single producer of a data to another vertex and a single consumer of data from another vertex.

Loop unrolling directives can indicate that an HLL program loop is to be unrolled into HDL code that is non-iterative. A loop unrolling directive can be inserted in the HLL specification in response to identifying a loop in the data flow graph and determining that there is no interdependency among variables inside the loop. No interdependency amongst variables exists if the value of any one of the variables is not a function of the value of any other of the variables.

Hardware inference directives can indicate that a particular circuit element is to be used in the HDL specification. For example, multiplication, multiply-and-accumulate, pattern matching, shifting can be identified in the AST, and in response the tool can insert a hardware inference directive indicating specification in the HDL of a digital signal processor to perform the operation.

At block 220, the tool generates an HLL test bench. The captured stimuli and responses from the first simulation (block 206) indicate the input data to be provided to the DUT and the expected responses from the DUT. The stimuli of the first simulation can be replicated in the HLL test bench by function calls to HLL functions generated from the data flow graph.

A second simulation using the HLL specification of the DUT and the HLL test bench is run at block 222. Output from the HLL functions can be compared to the responses from the first simulation to verify correct operation. If the results of the HLL simulation do not match the results of the block-based simulation, decision block 224 directs the tool to block 226 to report an error. Otherwise, at block 228, the tool generates an HDL specification of the circuit design from the HLL specification.

At block 230, the tool can generate circuit implementation data. The tool can perform HDL synthesis, technology mapping, place-and-route and additional simulations for verifying correctness and performing circuit optimization processes. The circuit implementation data can be a configuration bitstream for programmable logic or data that specifies fabrication details for an ASIC, for example. At block 232, a circuit can be implemented and made by way of configuring a programmable IC with a configuration bitstream or fabricating, making, or producing an ASIC from the implementation data, thereby creating a circuit that operates according to the resulting circuit design.

Figure 5:
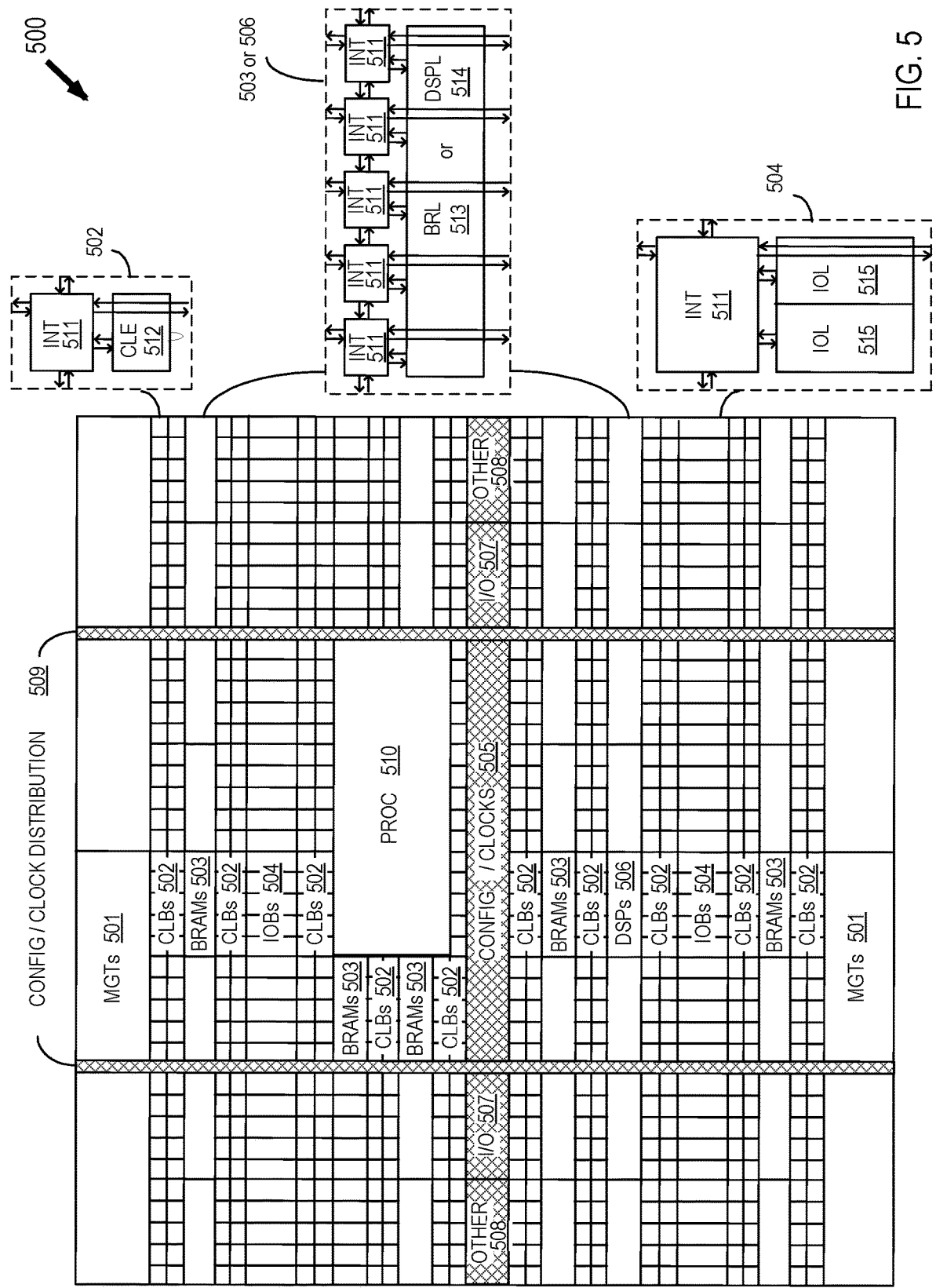
FIG. 5 shows a programmable integrated circuit (IC) on which a circuit design processed according to the disclosed methods and systems can be implemented.

FIG. 5 shows a programmable integrated circuit (IC) 500 on which a circuit design processed according to the disclosed methods and systems can be implemented. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

A columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Figure 6:
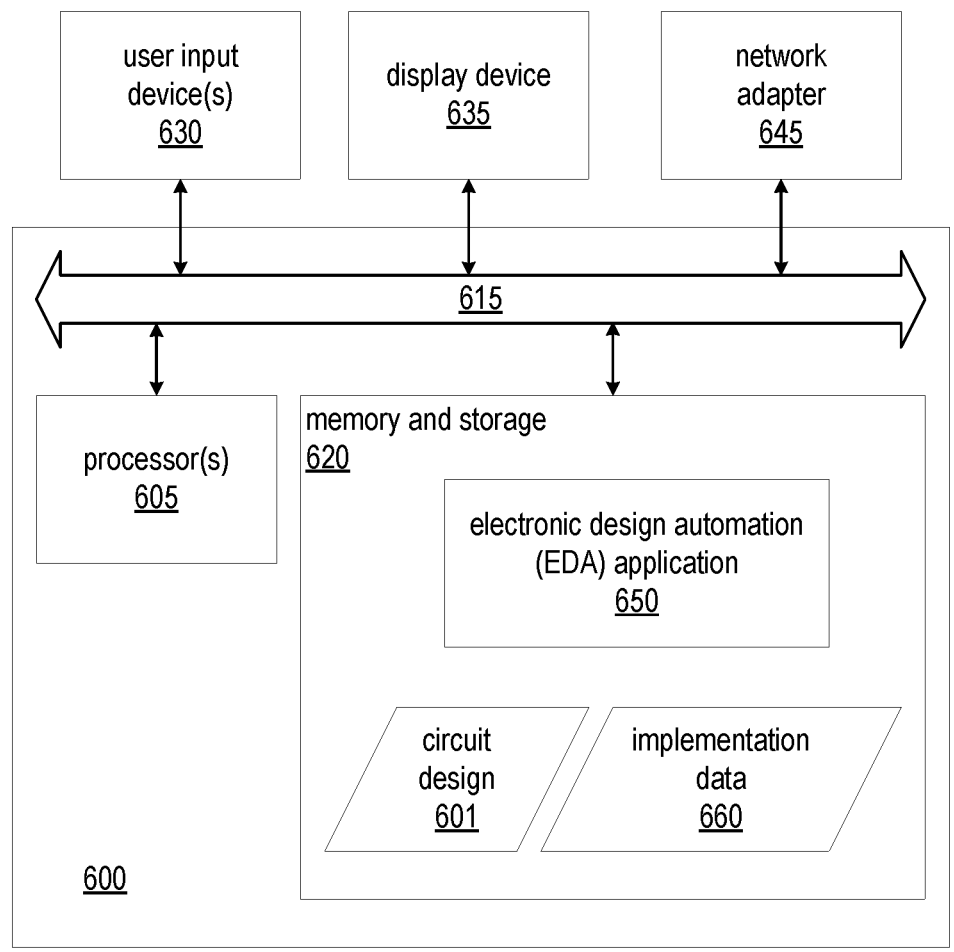
FIG. 6 is a block diagram illustrating an exemplary data processing system.

FIG. 6 is a block diagram illustrating an exemplary data processing system (system) 600. System 600 is an example of an EDA system. As pictured, system 600 includes at least one processor circuit (or "processor"), e.g., a central processing unit (CPU) 605 coupled to memory and storage arrangement 620 through a system bus 615 or other suitable circuitry. System 600 stores program code and circuit design 601 within memory and storage arrangement 620. Processor 605 executes the program code accessed from the memory and storage arrangement 620 via system bus 615. In one aspect, system 600 is implemented as a computer or other data processing system that is suitable for storing and/or executing program code. It should be appreciated, however, that system 600 can be implemented in the form of any system including a processor and memory that is capable of performing the functions described within this disclosure.

Memory and storage arrangement 620 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 600 may also include one or more cache memories (not shown) that provide temporary storage of at least some program code and data in order to reduce the number of times program code and data must be retrieved from local memory and persistent storage during execution.

Input/output (I/O) devices such as user input device(s) 630 and a display device 635 may be optionally coupled to system 600. The I/O devices may be coupled to system 600 either directly or through intervening I/O controllers. A network adapter 645 also can be coupled to system 600 in order to couple system 600 to other systems, computer systems, remote printers, and/or remote storage devices through intervening private or public networks. Modems, cable modems, Ethernet cards, and wireless transceivers are examples of different types of network adapter 645 that can be used with system 600.

Memory and storage arrangement 620 may store an EDA application 650. EDA application 650, being implemented in the form of executable program code, is executed by processor(s) 605. As such, EDA application 650 is considered part of system 600. System 600, while executing EDA application 650, receives and operates on HLL circuit design 601. In one aspect, system 600 performs the described design flow on HLL circuit design 601. System 600 generates circuit implementation data 660 from the HLL circuit design 601 as described above.

EDA application 650, HLL circuit design 601, circuit implementation data 660, and any data items used, generated, and/or operated upon by EDA application 650 are functional data structures that impart functionality when employed as part of system 600 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for creating circuit designs and preparing circuit implementation data for making an integrated circuit that functions according to the circuit design. Other aspects and features will be apparent to those skilled in the art from consideration of the specification. The methods and system or parts thereof can be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
   converting a block model of a block-based circuit design to a high-level language (HLL) specification by a design tool executing on a computer system, wherein the converting the block model to the HLL specification includes generating a data flow graph from the block model;
   determining one or more hardware optimization directives from the data flow graph by the design tool;
   adding the one or more hardware optimization directives to the HLL specification;
   converting the HLL specification to a hardware description language (HDL) specification by the design tool; and
   generating circuit implementation data from the HDL specification by the design tool, the circuit implementation data for making an integrated circuit that performs functions specified by the circuit design.

2. The method of claim 1, wherein:
   the determining the one or more hardware optimization directives includes determining the one or more hardware optimization directives based on data types of ports of blocks of the block model; and
   the adding the one or more hardware optimization directives includes:
      adding a streaming interface directive in response to specification of a one-dimensional or a two-dimensional data signal on a port of a block; and
      adding a bi-directional point-to-point interface directive in response to specification of a scalar data signal on a port of a block.

3. The method of claim 1, wherein the one or more hardware optimization directives include a data flow directive.

4. The method of claim 1, wherein:
   the determining the one or more hardware optimization directives includes determining the one or more hardware optimization directives based on a specification of sequential operation of two or more blocks of the block model; and
   the adding the one or more hardware optimization directives includes adding a pipelining directive in response to determining the specification of sequential operation of two or more blocks of the block model.

5. The method of claim 1, wherein:
   the determining the one or more hardware optimization directives includes determining the one or more hardware optimization directives based on presence of a loop in the data flow graph; and
   the adding the one or more hardware optimization directives includes adding an unroll directive in response to the presence of the loop in the data flow graph.

6. The method of claim 1, wherein the one or more hardware optimization directives include specification of one or more of a digital signal processor or a shift register.

7. The method of claim 1, further comprising:
   simulating the block model by the design tool;
   capturing simulation input data to the block model and first simulation output data from the block model;
   generating an HLL test bench from the simulation input data and the first simulation output data;
   simulating using the HLL specification and the HLL test bench; and
   verifying expected behavior of the HLL specification based equivalence of the first simulation output data and second simulation output data from the simulating using the HLL specification.

8. The method of claim 7, wherein the generating circuit implementation data includes synthesizing and placing and routing the HDL specification by the design tool.

9. The method of claim 8, further comprising making an integrated circuit from the circuit implementation data.

10. A system comprising:
    a computer processor;
    a memory arrangement, wherein the memory arrangement is configured with instructions that when executed by the computer processor cause the computer processor to:
       convert a block model of a circuit design to a high-level language (HLL) specification, wherein the instructions that convert the block model to the HLL specification include instructions that generate a data flow graph from the block model;
       determine one or more hardware optimization directives from the data flow graph;
       add the one or more hardware optimization directives to the HLL specification;
       convert the HLL specification to a hardware description language (HDL) specification; and generate circuit implementation data from the HDL specification, the circuit implementation data for making an integrated circuit that performs functions specified by the circuit design.

11. The system of claim 10, wherein:
the instructions that determine the one or more hardware optimization directives include instructions that determine the one or more hardware optimization directives based on data types of ports of blocks of the block model; and
the instructions that add the one or more hardware optimization directives include instructions that:
add a streaming interface directive in response to specification of a one-dimensional or a two-dimensional data signal on a port of a block; and
add a bi-directional point-to-point interface directive in response to specification of a scalar data signal on a port of a block.

12. The system of claim 10, wherein the one or more hardware optimization directives include a data flow directive.

13. The system of claim 10, wherein:
the instructions that determine the one or more hardware optimization directives include instructions that determine the one or more hardware optimization directives based on a specification of sequential operation of two or more blocks of the block model; and
the instructions that add the one or more hardware optimization directives include instructions that add a pipelining directive in response to determining the specification of sequential operation of two or more blocks of the block model.

14. The system of claim 10, wherein:
the instructions that determine the one or more hardware optimization directives include instructions that determine the one or more hardware optimization directives based on presence of a loop in the data flow graph; and
the instructions that add the one or more hardware optimization directives include instructions that add an unroll directive in response to the presence of the loop in the data flow graph.

15. The system of claim 10, wherein the one or more hardware optimization directives include specification of one or more of a digital signal processor or a shift register.

16. The system of claim 10, wherein the memory arrangement is further configured with instructions that when executed cause the computer processor to:
simulate the block model;
capture simulation input data to the block model and first simulation output data from the block model;
generate an HLL test bench from the simulation input data and the first simulation output data;
simulate using the HLL specification and the HLL test bench; and
verify expected behavior of the HLL specification based equivalence of the first simulation output data and second simulation output data from the simulating using the HLL specification.

17. The system of claim 16, wherein the instructions that generate circuit implementation data include instructions that synthesize and place and route the HDL specification.

18. The system of claim 17, wherein the memory arrangement is further configured with instructions that when executed cause the computer processor to configure an integrated circuit with the circuit implementation data.

* * * * *